United States Patent
Tsai et al.

(10) Patent No.: US 8,624,338 B2
(45) Date of Patent: Jan. 7, 2014

(54) MULTI-NANOMETER-PROJECTION APPARATUS FOR LITHOGRAPHY, OXIDATION, INSPECTION, AND MEASUREMENT

(75) Inventors: Fei-Gwo Tsai, Tainan (TW); Chwen Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 162 days.

(21) Appl. No.: 13/101,443

(22) Filed: May 5, 2011

(65) Prior Publication Data

US 2012/0280333 A1 Nov. 8, 2012

(51) Int. Cl.
*H01L 29/82* (2006.01)
(52) U.S. Cl.
USPC .......................................................... 257/415
(58) Field of Classification Search
USPC .......................................................... 257/415
See application file for complete search history.

(56) References Cited

U.S. PATENT DOCUMENTS

| | | | |
|---|---|---|---|
| 8,003,982 B2 * | 8/2011 | Wang et al. | 257/43 |
| 2005/0176947 A1 * | 8/2005 | An et al. | 536/23.7 |
| 2008/0273424 A1 * | 11/2008 | Wodnicki et al. | 367/180 |
| 2009/0199392 A1 * | 8/2009 | Singh et al. | 29/594 |
| 2012/0228995 A1 * | 9/2012 | Mohamadi | 310/319 |

OTHER PUBLICATIONS

Y.R. Ma et al., "Tip-Induced Local Anodic Oxidation on the Native SiO2 Layer of Si(111) Using an Atomic Force Microscope", Physical Review B, vol. 64, 195324-1 through 195324-5, 2001.
A. Majumdar et al., "Nanometer-Scale Lithography Using the Atomic Force Microscope", Appl. Phys. Letter 61, (19) Nov. 9, 1992, pp. 2293-2295.

* cited by examiner

*Primary Examiner* — Thien F Tran
(74) *Attorney, Agent, or Firm* — Haynes and Boone, LLP (57) ABSTRACT

An apparatus, method for manufacturing the apparatus, and method for processing a substrate using the apparatus are disclosed. An exemplary apparatus includes a substrate having a plurality of cells, wherein each cell includes a cell structure. The cell structure includes a piezoelectric film portion and a tip disposed over the piezoelectric film portion. The tip is physically coupled with the piezoelectric film portion.

19 Claims, 6 Drawing Sheets

MULTI-NANOMETER-PROJECTION APPARATUS FOR LITHOGRAPHY, OXIDATION, INSPECTION, AND MEASUREMENT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
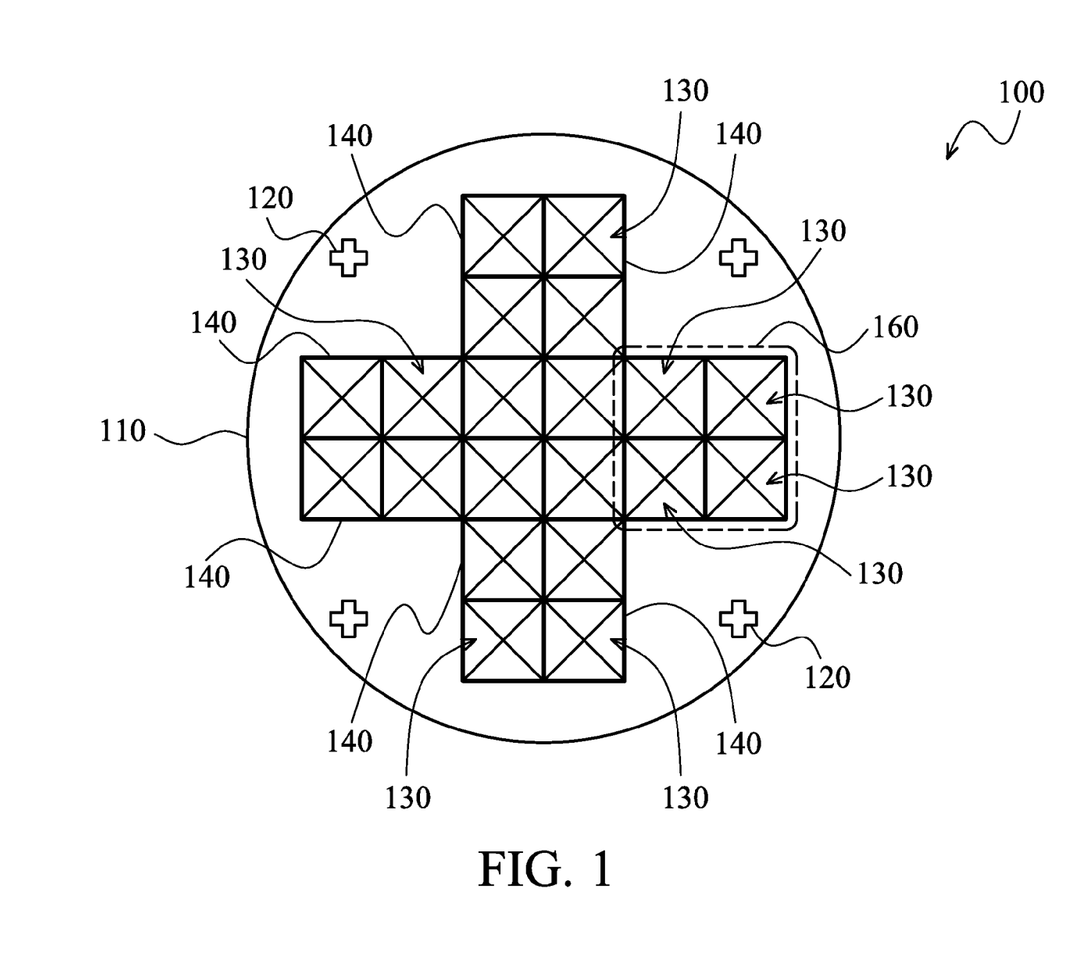
FIG. 1 is a top view of an apparatus that uses multiple tips to process a device substrate according to various aspects of the present disclosure.

FIG. 1 is a top view of an apparatus 100 according to various aspects of the present disclosure. The apparatus 100 uses multiple tips to process a device substrate (wafer), for example, an integrated circuit device substrate. FIG. 1 has been simplified for the sake of clarity to better understand the inventive concepts of the present disclosure. Additional features can be added in the apparatus 100, and some of the features described below can be replaced or eliminated in other embodiments of the apparatus 100.

The apparatus 100 includes a substrate (wafer) 110. In the depicted embodiment, the substrate 110 is a silicon substrate. The substrate 110 may be made of any silicon-containing material. Alternatively or additionally, the substrate 110 includes an elementary semiconductor, such as germanium; compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 110 is a semiconductor on insulator (SOI).

Alignment marks 120 are disposed in the substrate 110. The alignment marks 120 are configured so that the substrate 110 may be aligned with the device substrate to be processed. The alignment marks 120 may include a polysilicon structure, a metal structure, a dielectric structure, or a combination thereof. The apparatus 100 may include fewer or more alignment marks 120 than those illustrated in FIG. 1.

The substrate 110 includes cells 130. As discussed further below, each cell 130 includes a cell structure that includes a tip that may be used for processing the device substrate. For example, the tip may be used to perform lithography processes, oxidation processes, inspection processes, measurement processes, other suitable process, or combinations thereof, on the device substrate. In the depicted embodiment, each cell 130 has a substantially square shape. In an example, a length of each cell 130 is about 60 μm to about 140 μm, and a width of each cell 130 is about 60 μm to about 140 μm. In an example, each cell 130 has a length of about 100 μm and a width of about 100 μm. Alternatively, the cells 130 may have shapes other than substantially square shaped.

Isolation features 140 are disposed in the substrate 110. In the depicted embodiment, an isolation feature 140 surrounds each cell 130, isolating the cells 130 from one another. The isolation features 140 utilize isolation technology, such as local oxidation of silicon (LOCOS) and/or shallow trench isolation (STI), to define and/or electrically isolate the various cells 130 and/or other regions of the substrate 110. In the depicted embodiment, the isolation features 140 are trenches, specifically shallow trench isolation trenches, that are filled with a dielectric material, such as silicon oxide, silicon nitride, silicon oxynitride, other suitable material, or combinations thereof. The isolation features 140 may be formed by any suitable process. As one example, forming an STI includes using a lithography process to expose portions of the substrate, etching a trench in each respective exposed portion of the substrate (for example, by using a dry etching process and/or a wet etching process), and filling the trench (for example, by using a chemical vapor deposition process) with one or more dielectric materials. For example, the filled trench may have a multi-layer structure, such as a thermal oxide liner layer filled with silicon nitride or silicon oxide.

Figure 2:
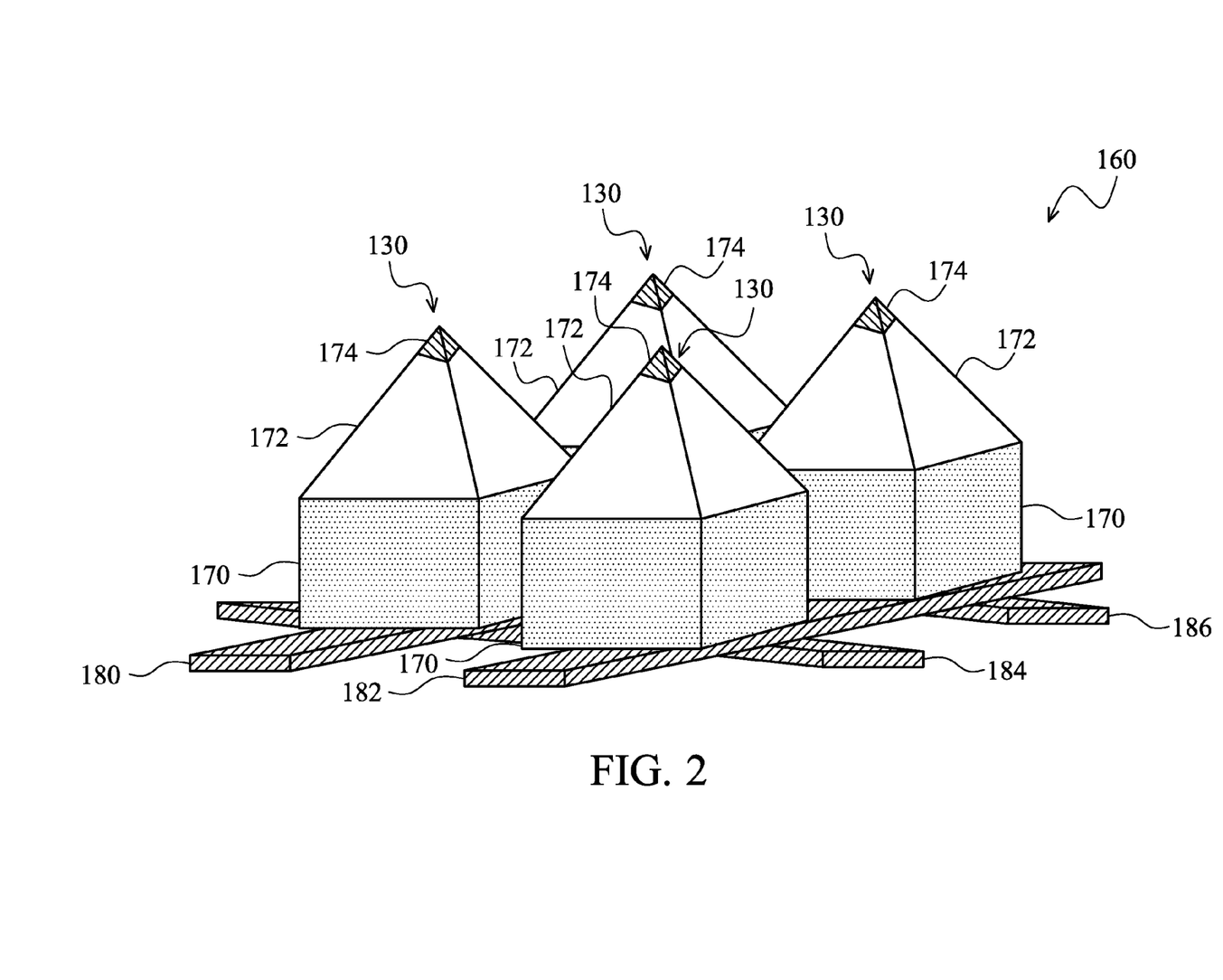
FIG. 2 is a perspective view of a portion of the apparatus of FIG. 1 according to various aspects of the present disclosure.

FIG. 2 is a perspective view of a portion 160 of the apparatus 100 of FIG. 1 according to various aspects of the present disclosure. FIG. 2 has been simplified for the sake of clarity to better understand the inventive concepts of the present disclosure. For example, in the depicted embodiment, the substrate 110 and isolation features 140 are omitted from the perspective view of the portion 160 of the apparatus 100. Additional features can be added in the portion 160 of the apparatus 100, and some of the features described below can be replaced or eliminated in other embodiments of the portion 160 of the apparatus 100.

The portion 160 of the apparatus 100 includes four cells 130 including cell structures. Alternative examples may include more of less cells 130 than illustrated in FIG. 2. Each cell 130 includes a piezoelectric feature 170. The piezoelectric feature 170 includes a piezoelectric material, such as berlinite ($AlPO_4$), quartz ($SiO_2$), gallium orthophosphate ($GaPO_4$), langasite ($La_3Ga_5SiO_{14}$), barium titanate ($BaTiO_3$), lead titanate ($PbTiO_3$), lead zirconate titanate ($Pb[Zr_xTi_{1-x}]O_3$) (PZT), potassium niobate ($KNbO_3$), lithium niobate ($LiNbO_3$), lithium tantalate ($LiTaO_3$), sodium tungstate ($Na_2WO_3$), $Ba_2NaNb_5O_5$, $Pb_2KNb_5O_{15}$, sodium potassium niobate (NaKNb), bismuth ferrite ($BiFeO_3$), sodium niobate (NaNbO3), other piezoelectric material, or combination thereof.

Each cell 130 also includes a tip that is physically coupled with the piezoelectric feature 170. In the depicted embodiment, the tip includes a base portion 172 and a tip portion 174. The base portion 172 is disposed over the piezoelectric film portion 170, and the tip portion 174 is disposed over the base portion 172. In the depicted embodiment, the base portion 172 includes a semiconductor material, such as silicon. The silicon base portion 172 may be doped n-type or p-type. Alternatively or additionally, the base portion 172 may include other materials, such as silicon nitride. Further, in the depicted embodiment, the tip portion 174 includes a conductive material, such as platinum. Alternatively or additionally, the tip portion 174 may include other conductive material, such as PtIr or TiN. In an example, the tip has a curvature radius of about 5 nm to about 10 nm. In an example, an area of each tip is about 0.01 mm². In an example, each tip can write a line width of about 10 nm to about 20 nm.

Various biasing features 180, 182, 184, and 186 are electrically coupled with respective piezoelectric features 170. In the depicted embodiment, the biasing features 180, 182, 184, and 186 include a conductive material, such as copper, aluminum, other suitable conductive material, or combinations thereof. The biasing features 180, 182, 184, and 186 may apply a bias voltage to respective piezoelectric features 170 to change a shape of the respective piezoelectric features 170. By biasing the piezoelectric features 170, each piezoelectric feature 170 controls a position (and movement) of its respective tip, specifically a position (and movement) of the base portion 172 and the tip portion 174. More specifically, each tip may be moved in an x direction, y direction, and/or z direction by biasing its respective piezoelectric feature 170.

Figure 3:
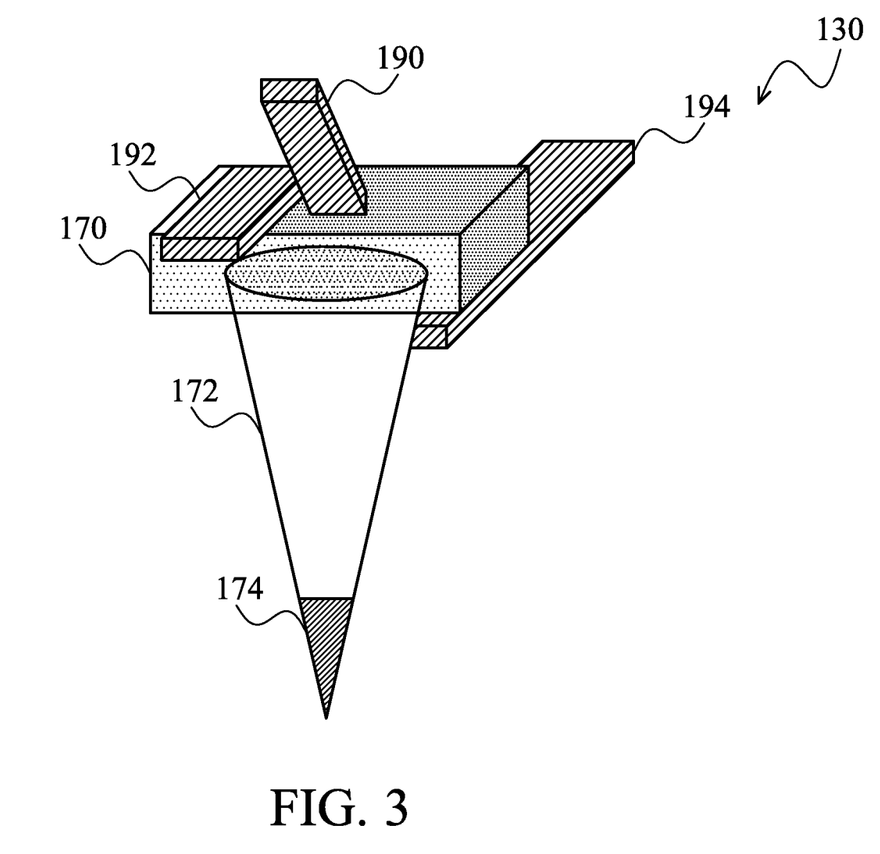
FIG. 3 is a perspective view of a cell of the apparatus of FIG. 1 according to various aspects of the present disclosure.

FIG. 3 is a perspective view of a cell 130 of the apparatus 100 of FIG. 1 according to various aspects of the present disclosure. FIG. 3 has been simplified for the sake of clarity to better understand the inventive concepts of the present disclosure. For example, in the depicted embodiment, the substrate 110 and isolation features 140 are omitted from the perspective view of the cell 130 of the apparatus 100. Additional features can be added in the cell 130 of the apparatus 100, and some of the features described below can be replaced or eliminated in other embodiments of the cell 130 of the apparatus 100.

The cell 130 includes a cell structure having the piezoelectric feature 170 and a tip physically coupled with the piezoelectric feature 170. The tip includes the base portion 172 and the tip portion 174. In the depicted embodiment, biasing features 190 and 192 are electrically coupled with the piezoelectric feature 170. Similar to biasing features 180, 182, 184, and 186, the biasing features 190 and 192 may apply a bias voltage to piezoelectric feature 170 to change a shape of the piezoelectric feature 170. By biasing the piezoelectric feature 170, the piezoelectric feature 170 can control a position (and movement) of the tip, specifically a position (and movement) of the base portion 172 and the tip portion 174. More specifically, each tip may be moved in an x direction, y direction, and/or z direction by biasing the piezoelectric feature 170. In the depicted embodiment, a biasing feature 194 is electrically coupled with the tip (base portion 172/tip portion 174). The biasing feature 194 may apply a bias voltage to the tip so that the tip processes the device substrate according to the applied bias voltage. In an example, a bias voltage of about 10 V to about 100 V may be applied to the tip via the biasing feature 194 to achieve various processing of the device substrate. For example, the bias voltage may be tuned, such that the tips write a particular line width.

Figure 4:
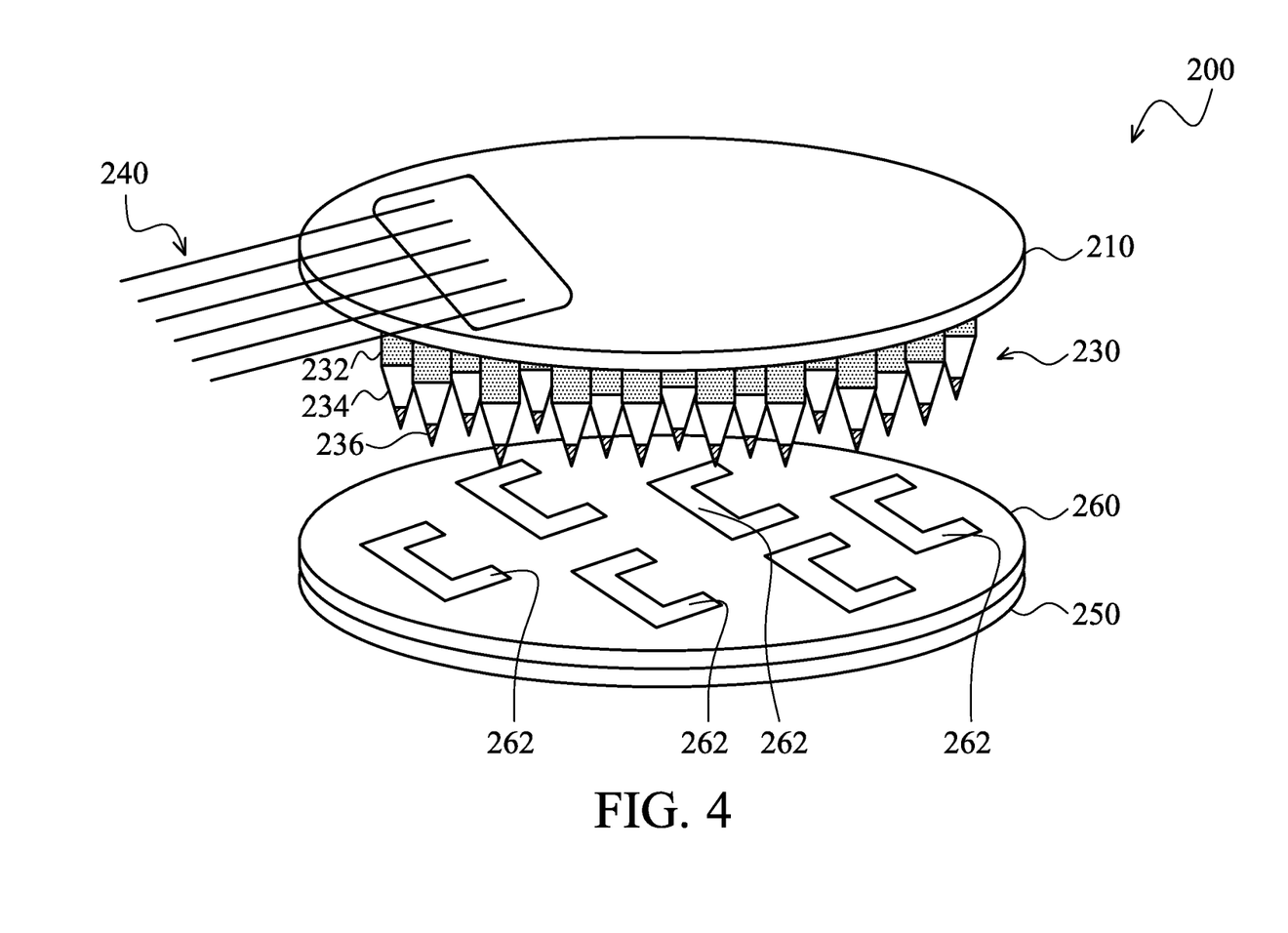
FIG. 4 is a perspective view of a process performed on a device substrate using an apparatus having multiple tips according to various aspects of the present disclosure.

FIG. 4 is a perspective view of a process performed on a device substrate using an apparatus 200 having multiple tips according to various aspects of the present disclosure. FIG. 4 has been simplified for the sake of clarity to better understand the inventive concepts of the present disclosure. Additional features can be added in the apparatus 200 and the device substrate, and some of the features described below can be replaced or eliminated in other embodiments of the apparatus 200 and the device substrate.

The apparatus 200 includes a substrate (wafer) 210 having an array of cell structures 230. Each cell structure includes a piezoelectric feature 232 and a tip having a base portion 234 and a tip portion 236. The tip is physically coupled with the piezoelectric feature 232. The substrate 210, piezoelectric feature 232, base portion 234, and tip portion 236 are respectively similar to the substrate 110, piezoelectric feature 170, base portion 172, and tip portion 174 described above. Biasing features (not illustrated) are electrically coupled with each cell structure 230. In an example, each cell structure 230 includes a biasing feature electrically coupled with the piezoelectric feature 232 and a biasing feature electrically coupled with the tip (base portion 234/tip portion 236). The apparatus 200 further includes conductive features 240 electrically coupled with the substrate 210, which can be used to apply the various bias voltages to the biasing features, and thus to the piezoelectric features 232 and tips of the apparatus 200, to achieve processing of the device substrate.

The apparatus 200 is positioned over a wafer stage 250, which has a device substrate 260 positioned thereon. The device substrate may be a semiconductor substrate, a mask blank, a glass substrate, a flat panel substrate, or other suitable substrate. The device substrate may include a recording medium, such as an energy sensitive resist (or material) layer, formed thereon. In FIG. 4, the apparatus 200 performs a lithography process on the device substrate 260 without using a mask. The lithography process is performed by applying various biases to each cell structure 230 of the apparatus 200 to expose the device substrate 260, such that the device substrate 260 records a pattern (or design) therein. In the depicted embodiment, the exposed device substrate 260 has been developed, such that it includes various patterns 262. The patterns 262 may be formed by trenches disposed in the device substrate 260.

More specifically, various biasing voltages are applied to the piezoelectric features 232 of each cell structure 230 to position each corresponding tip in the x-direction, y-direction, and/or z-direction. Various biasing voltages are also applied to the tips to achieve the desired patterns 262 as the apparatus 200 is scanned across the device substrate 260. As the apparatus 200 is brought in close proximity to the device substrate 260, the various bias voltages applied to the array of cell structures 230 can cause electron reactions between the apparatus 200 and the device substrate 260 at various locations. For example, various biases can be applied to the tips of the cell structures 230 to cause the tips to act as an electron beam writer, such that electrons emitted from the tips of the cell structures 230 break chemical bonds of an energy sensitive layer disposed over the device substrate 260. Where the patterns 262 formed in the device substrate 260, the tips of the cell structures 230 corresponding with the patterns 262 were positioned proximate to the device substrate 260 via the biasing voltages applied to the corresponding piezoelectric features 232, and the tips were biased to cause an electron reaction between the apparatus 200 and certain locations of the device substrate 260, such that bonds of the exposed device substrate 260 were broken down. Essentially, the tips of the apparatus 200 facilitate an electron beam type reaction between the apparatus 200 and the device substrate 260. It is understood that a biasing voltage may also be applied to the device substrate 260. Accordingly, various biasing may be applied to the apparatus 200 and the device substrate 260 to achieve various patterning results.

Figure 5:
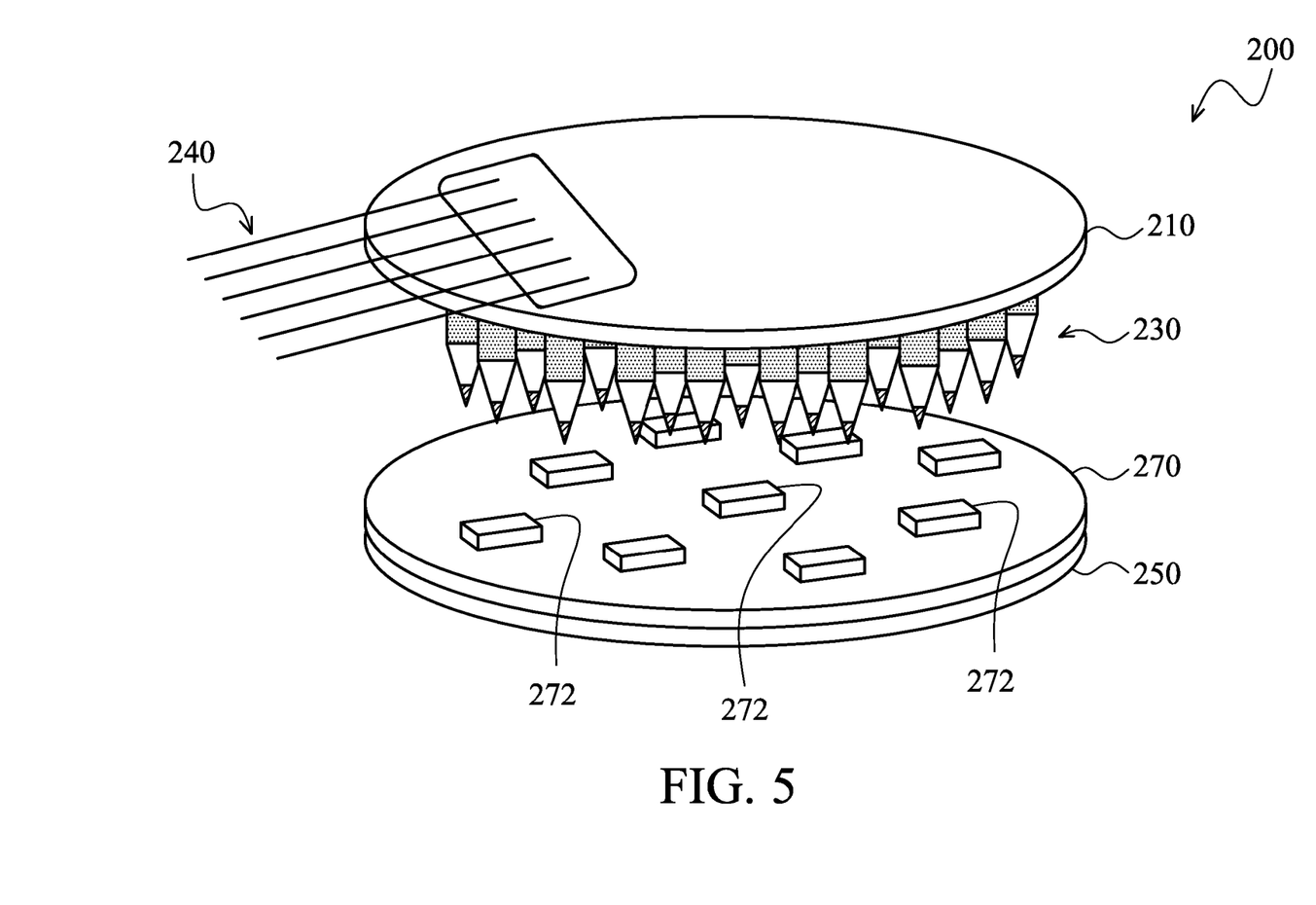
FIG. 5 is a perspective view of another process performed on a device substrate using an apparatus having multiple tips according to various aspects of the present disclosure.

FIG. 5 is a perspective view of another process performed on a device substrate using the apparatus 200 having multiple tips according to various aspects of the present disclosure. FIG. 5 has been simplified for the sake of clarity to better understand the inventive concepts of the present disclosure. Additional features can be added in the apparatus 200 and the device substrate, and some of the features described below can be replaced or eliminated in other embodiments of the apparatus 200 and the device substrate.

In FIG. 5, the apparatus 200 is positioned over the wafer stage 250, which has a device substrate 270 positioned thereon. The device substrate 270 is similar to the device substrate 260. In the depicted embodiment, the device substrate 270 is a semiconductor substrate including silicon. In FIG. 5, the apparatus 200 performs an oxidation process on the device substrate 270 without using a mask. The oxidation process is performed by applying various biases to each cell structure 230 of the apparatus 200 to form oxide features 272, such as silicon oxide features, over the device substrate 270. More specifically, various biasing voltages are applied to the piezoelectric features 232 of each cell structure 230 to position each corresponding tip in the x-direction, y-direction, and/or z-direction. Various biasing voltages are also applied to the tips to achieve the desired oxide features 272 as the apparatus 200 is scanned across the device substrate 270. As the apparatus 200 is brought in close proximity to the device substrate 270, the various bias voltages applied to the array of cell structures 230 can cause electron reactions between the apparatus 200 and the device substrate 270 at various locations. For example, where the oxide features 272 form over the device substrate 270, the tips of the cell structures 230 corresponding with the oxide features 272 were positioned proximate to the device substrate 270 via the biasing voltages applied to the corresponding piezoelectric features 232, and the tips were biased to cause an electron reaction between the apparatus 200 and the device substrate 270, such that the various oxide features 272 were formed. Essentially, the tips of the apparatus 200 facilitate an electron beam type reaction between the apparatus 200 and the device substrate 270. It is understood that a biasing voltage may also be applied to the device substrate 270. Accordingly, various biasing may be applied to the apparatus 200 and the device substrate 270 to achieve various oxidation results.

Figure 6:
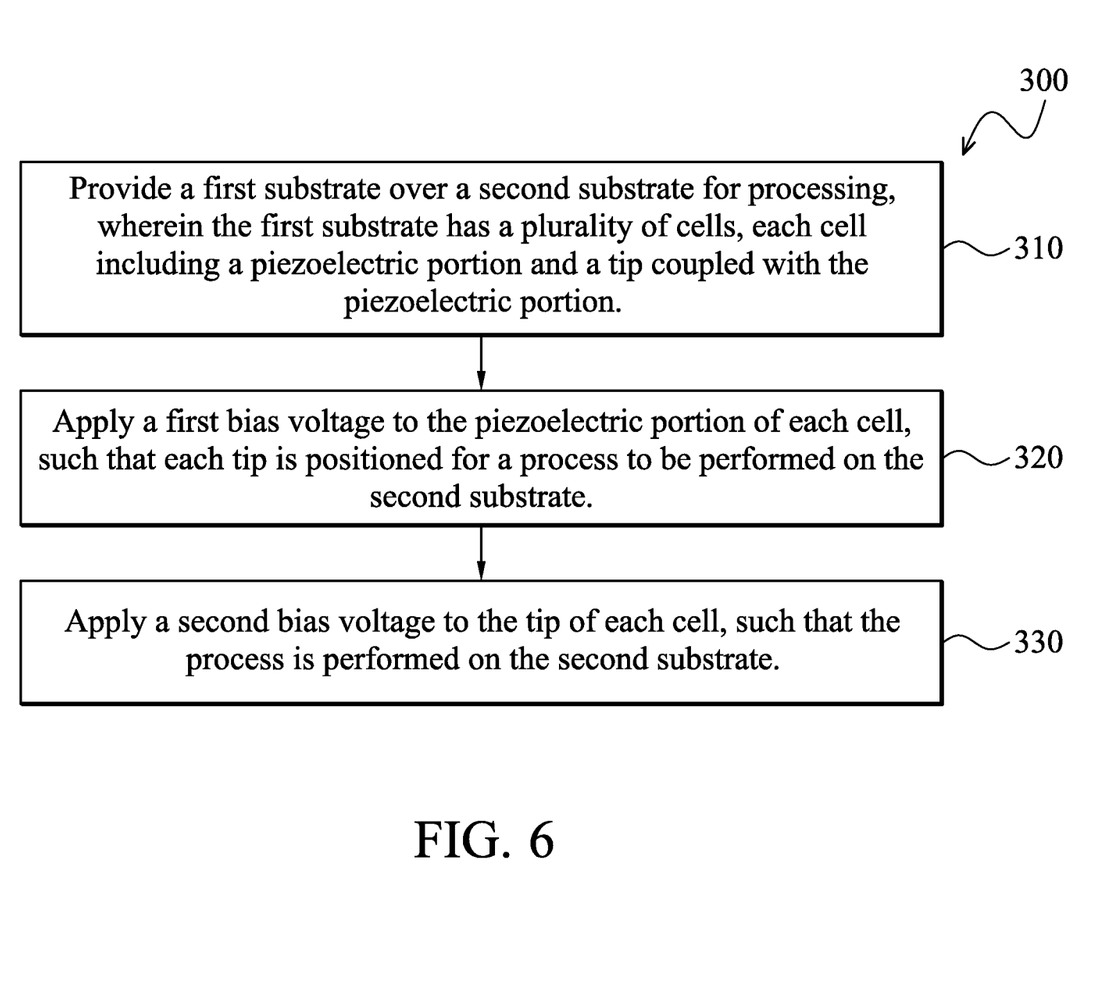
FIG. 6 is a flow chart of a method for processing a device substrate using an apparatus having multiple tips according to various aspects of the present disclosure.

FIG. 6 is a flow chart of a method 300 for processing a device substrate using an apparatus having multiple tips according to various aspects of the present disclosure. The method 300 begins at block 310 where a first substrate is provided over a second substrate for processing. The first substrate has a plurality of cells, each cell including a piezoelectric portion and a tip coupled with the piezoelectric portion. The first substrate may be the apparatus described herein, such as the apparatus 100 or the apparatus 200. The second substrate 200 may be a device substrate, such as an integrated device substrate. At block 320, a first bias voltage is applied to the piezoelectric portion of each cell, such that each tip is positioned for a process to be performed on the second substrate. For example, each tip may be positioned in the x-direction, the y-direction, and/or the z-direction. At block 330, a second bias voltage is applied to the tip of each cell, such that the process is performed on the second substrate. The first and second bias voltages may achieve a lithography process (in other words, patterns the second substrate such as that described with reference to FIG. 4) or an oxidation process (in other words, forms oxide features over the second substrate such as that described with reference to FIG. 5) on the second substrate. Using the first substrate, the lithography and oxidation processes may be performed on the second substrate without using a mask. The first and second bias voltages may also perform a measurement process (for example, a process that evaluates a profile of the second substrate) or an inspection process (for example, a process that evaluates the profile for defects and/or contamination). The first and second voltages may also perform various other process on the second substrate. Additional steps can be provided before, during, and after the method 300, and some of the steps described can be replaced or eliminated for other embodiments of the method.

In an example, a test substrate that is similar to the first substrate may be pre-scan the second substrate before performing the process on the second substrate. The test substrate includes a plurality of cells, each cell including a piezoelectric portion and a tip coupled with the piezoelectric portion. The test substrate may be the apparatus described herein, such as the apparatus 100 or the apparatus 200. In contrast to the first substrate, the test substrate includes tips that are larger than the tips of the first substrate. The pre-scan with the test substrate may remove particles from the second substrate before the first substrate performs the process. This can advantageously extend the life of the first substrate for device substrate processing.

In an example, the first substrate includes tips that write line widths of about 10 nm to about 20 nm on the second substrate. The line width written can be adjusted by varying the bias current or position height applied to the tips of each cell. For example, the bias current of a tip of the first substrate may be varied to write line widths of about 10 nm to about 20 nm on a first stripe. If a line width greater than 20 nm is desired, adjacent first and second tips may be biased to achieve the desired line width. For example, to write a line having a width of about 23 nm on the second substrate, a bias current of the first tip of the first substrate may be adjusted to write a line having a width of about 11 nm as a first stripe on the second substrate, and a bias current of the adjacent second tip of the first substrate may be adjusted to write a line width of about 12 nm as a second stripe on the second substrate. The first and second stripes would combine to form a line (or stripe) on the second substrate that has a width of about 23 nm.

The disclosed multi-tip apparatus is particularly useful for processing as technology nodes continually scale down, such as to 20 nm technology nodes and below. For example, lithography processes and oxidation processes may be performed with the multi-tip apparatus described herein without using a mask, which can reduce processing time and costs. Further, using the apparatus for performing the oxidation process can eliminate thermal budgets typically required in conventional processing. The multi-tip apparatus can also be used to perform inspection and measurement processes. It has also been observed that the multi-tip apparatus can facilitate electron beam type reactions with the processed substrate without suffering from issues that typically arise in conventional electron beam writing, such as electron space charging effects and/or secondary electron defects. Different embodiments may have different advantages, and no particular advantage, such as those described above, is necessarily required of any embodiment.

The present disclosure provides for many different embodiments. For example, an apparatus for processing a substrate (or wafer) is disclosed. An exemplary apparatus includes a substrate having a plurality of cells. Each cell includes a cell structure having a piezoelectric film portion, and a tip disposed over the piezoelectric film portion. The tip is physically coupled with the piezoelectric film portion. The apparatus may further include a first biasing feature electrically coupled with the piezoelectric film portion, where the piezoelectric film portion and the first biasing feature are configured such that a position of the tip adjusts when the first biasing feature varies a first bias applied to the piezoelectric film portion. The apparatus may further include a second biasing feature electrically coupled with the tip, where the tip and the second biasing feature are configured such that the tip processes another substrate according to a second bias applied to the tip by the second biasing feature. The first biasing feature may include aluminum, copper, or a combination thereof. The second biasing feature may include aluminum, copper, or a combination thereof. The substrate may include silicon. In an example, the tip includes a first portion disposed over the piezoelectric film portion, and a second portion disposed over the first portion. The first portion may include a semiconductor material, such as silicon. The second portion includes a conductive material, such as platinum. In an example, the tip has a curvature radius of about 5 nm to about 10 nm. The tip may have a tip area of about 0.01 mm$^2$. The plurality of cells may be isolated from one another by an isolation features, such as a shallow trench isolation (STI) feature.

In another example, a method for processing a substrate (or wafer) with the apparatuses described herein is provided. An exemplary method includes providing a first substrate over a second substrate for processing, wherein the first substrate has a plurality of cells, each cell including a piezoelectric portion and a tip coupled with the piezoelectric portion; applying a first bias voltage to the piezoelectric portion of each cell, such that each tip is positioned for a process to be performed on the second substrate; and applying a second bias voltage to the tip of each cell, such that the process is performed on the second substrate. The method may further include varying the first bias to the piezoelectric portion of each cell during the process performed on the second substrate. Applying the first bias to the piezoelectric portion of each cell such that each tip is positioned for the process to be performed on the second substrate may include controlling movement of each tip in an x, y, and z direction. Applying the second bias to the tip of each cell such that the process is performed on the second substrate may include performing a lithography process on the second substrate, performing an oxidation process on the second substrate, or performing one of a measurement process and an inspection process to the second substrate.

In yet another example, a method for fabricating the apparatuses described herein is provided. An exemplary method includes forming a plurality of piezoelectric features on a substrate; and forming a plurality of tips over the plurality of piezoelectric features, such that each piezoelectric feature is physically coupled with one of the plurality of tips. The method may further include forming a plurality of first biasing features, such that each piezoelectric feature is electrically coupled with one of the plurality of first biasing features. The method may further include forming a plurality of second biasing features, such that each tip is electrically coupled with one of the plurality of second biasing features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    a substrate having a plurality of cells, wherein each cell includes a cell structure having:
        a piezoelectric film portion;
        a tip disposed over the piezoelectric film portion, the tip being physically coupled with the piezoelectric film portion; and
        a first biasing feature electrically coupled with the piezoelectric film portion, the piezoelectric film portion and the first biasing feature being configured such that a position of the tip adjusts when the first biasing feature varies a first bias applied to the piezoelectric film portion.

2. The apparatus of claim 1 further including a second biasing feature electrically coupled with the tip, the tip and the second biasing feature configured such that the tip processes another substrate according to a second bias applied to the tip by the second biasing feature.

3. The apparatus of claim 2 wherein the first biasing feature and the second biasing feature include one of aluminum and copper.

4. The apparatus of claim 1 wherein the substrate includes silicon.

5. The apparatus of claim 1 wherein the tip includes a first portion disposed over the piezoelectric film portion and a second portion disposed over the first portion.

6. The apparatus of claim 5 wherein:
    the first portion includes a semiconductor material; and
    the second portion includes a conductive material.

7. The apparatus of claim 6 wherein:
the semiconductor material is silicon; and
the conductive material is platinum.

8. The apparatus of claim 1 wherein the tip has a curvature radius of about 5 nm to about 10 nm.

9. The apparatus of claim 1 wherein the tip has a tip area of less than or equal to about 0.01 mm$^2$.

10. The apparatus of claim 1 wherein the plurality of cells are isolated from one another by a shallow trench isolation (STI) feature.

11. An apparatus comprising:
a substrate having a plurality of cells, wherein each cell includes a cell structure having:
a piezoelectric film portion formed of a first material;
a tip disposed over the piezoelectric film portion, the tip being physically coupled with the piezoelectric film portion, wherein the tip is formed of a second material that is different than the first material; and
a biasing feature electrically coupled with the piezoelectric film portion, wherein the biasing feature applies a bias to the piezoelectric film portion to change a shape of the piezoelectric film portion.

12. The apparatus of claim 11, wherein the second material includes a semiconductor material.

13. The apparatus of claim 11, wherein the second material includes a conductive material.

14. The apparatus of claim 11, wherein the second material includes a semiconductive material and a conductive material.

15. The apparatus of claim 11, wherein the second material includes a conductive material disposed over and physically contacting a semiconductive material.

16. An apparatus comprising:
a substrate having a plurality of cells, wherein the plurality of cells are isolated from one another by an isolation feature, wherein each cell includes a cell structure having:
a piezoelectric film portion; and
a tip disposed over the piezoelectric film portion, the tip being physically coupled with the piezoelectric film portion, wherein the tip includes a conductive portion disposed over a semiconductive portion, wherein the conductive portion is different than the semiconductive portion.

17. The apparatus of claim 16, wherein the isolation feature includes a shallow trench isolation feature.

18. The apparatus of claim 16, wherein the conductive portion physically contact the semiconductive portion.

19. The apparatus of claim 16, further comprising a biasing feature electrically coupled with the piezoelectric film portion, wherein the biasing feature applies a bias to the piezoelectric film portion to change a shape of the piezoelectric film portion.

* * * * *